US012575186B2

(12) United States Patent
Rastogi et al.

(10) Patent No.: US 12,575,186 B2
(45) Date of Patent: Mar. 10, 2026

(54) CELL ARCHITECTURE FOR A SEMICONDUCTOR DEVICE

(71) Applicant: QUALCOMM Incorporated, San Diego, CA (US)

(72) Inventors: Sidharth Rastogi, Cork City (IE); Luca Mattii, Cork City (IE); Gerard Patrick Baldwin, Cork City (IE); Angelo Pinto, San Diego, CA (US); Satadru Sarkar, San Diego, CA (US); David Kidd, San Diego, CA (US); Ardavan Moassessi, San Diego, CA (US); Paul Penzes, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 375 days.

(21) Appl. No.: 17/383,208

(22) Filed: Jul. 22, 2021

(65) Prior Publication Data

US 2023/0022681 A1 Jan. 26, 2023

(51) Int. Cl.
H10D 89/10 (2025.01)
H10D 84/90 (2025.01)

(52) U.S. Cl.
CPC ........... H10D 89/10 (2025.01); H10D 84/907 (2025.01); H10D 84/975 (2025.01)

(58) Field of Classification Search
CPC ........... H01L 27/0207; H01L 27/11807; H01L 2027/11875; G06F 30/3953; H10D 89/10; H10D 84/907; H10D 84/975
See application file for complete search history.

(56) References Cited

U.S. PATENT DOCUMENTS

| | | | |
|---|---|---|---|
| 8,698,205 B2 | 4/2014 | Tzeng et al. | |
| 9,837,398 B1 * | 12/2017 | Rowhani | H01L 27/0207 |
| 2015/0041812 A1 * | 2/2015 | Cheng | H10B 12/36 |
| | | | 257/57 |
| 2016/0342726 A1 * | 11/2016 | Yuan | H01L 21/027 |
| 2017/0286584 A1 * | 10/2017 | Lefferts | G06F 30/394 |

(Continued)

OTHER PUBLICATIONS

International Search Report and Written Opinion—PCT/US2022/072594—ISA/EPO—Dec. 15, 2022.

(Continued)

*Primary Examiner* — Mounir S Amer
*Assistant Examiner* — Alexander Belousov
(74) *Attorney, Agent, or Firm* — Muncy, Geissler, Olds & Lowe, P.C./QUALCOMM

(57) ABSTRACT

In a first aspect, a semiconductor device includes a plurality of cells. Each cell of the plurality of cells includes four metal tracks running substantially parallel to each other in a first metal layer to provide signal routing and a plurality of wrapped channels having a pitch that is uniform among the plurality of wrapped channels. In a second aspect, a semiconductor device includes a plurality of cells. Each cell of the plurality of cells includes four metal tracks running substantially parallel to each other in a first metal layer to provide signal routing and a plurality of wrapped channels having an asymmetric distribution. For example, a first distance between a first pair of adjacent wrapped channels is different than a second distance between a second pair of adjacent wrapped channels.

20 Claims, 14 Drawing Sheets

(56) References Cited

U.S. PATENT DOCUMENTS

| | | | | |
|---|---|---|---|---|
| 2018/0145063 A1* | 5/2018 | Nelson | | H01L 27/0207 |
| 2018/0183439 A1* | 6/2018 | Sahu | | H03K 19/0948 |
| 2018/0190670 A1* | 7/2018 | Ryckaert | | H01L 27/11807 |
| 2018/0204765 A1* | 7/2018 | Song | | G03F 7/0002 |
| 2019/0220567 A1* | 7/2019 | Civay | | G06F 30/39 |
| 2020/0321355 A1* | 10/2020 | Jeong | | H01L 27/0207 |
| 2020/0328109 A1* | 10/2020 | Boemmels | | H01L 21/76877 |
| 2020/0381432 A1* | 12/2020 | Lee | | H01L 29/78696 |
| 2022/0093646 A1* | 3/2022 | Wu | | H01L 27/0207 |
| 2022/0199522 A1* | 6/2022 | Lee | | H10D 30/6735 |
| 2022/0415713 A1* | 12/2022 | Lin | | H01L 21/76895 |
| 2023/0022681 A1* | 1/2023 | Rastogi | | H01L 27/0207 |

OTHER PUBLICATIONS

Sherazi S.M.Y., et al., "Low Track Height Standard cell Design in iN7 using Scaling Boosters", Proceedings of the SPIE, 2017, pp. 1-9.
Partial International Search Report—PCT/US2022/072594—ISA/EPO—Sep. 21, 2022.

* cited by examiner

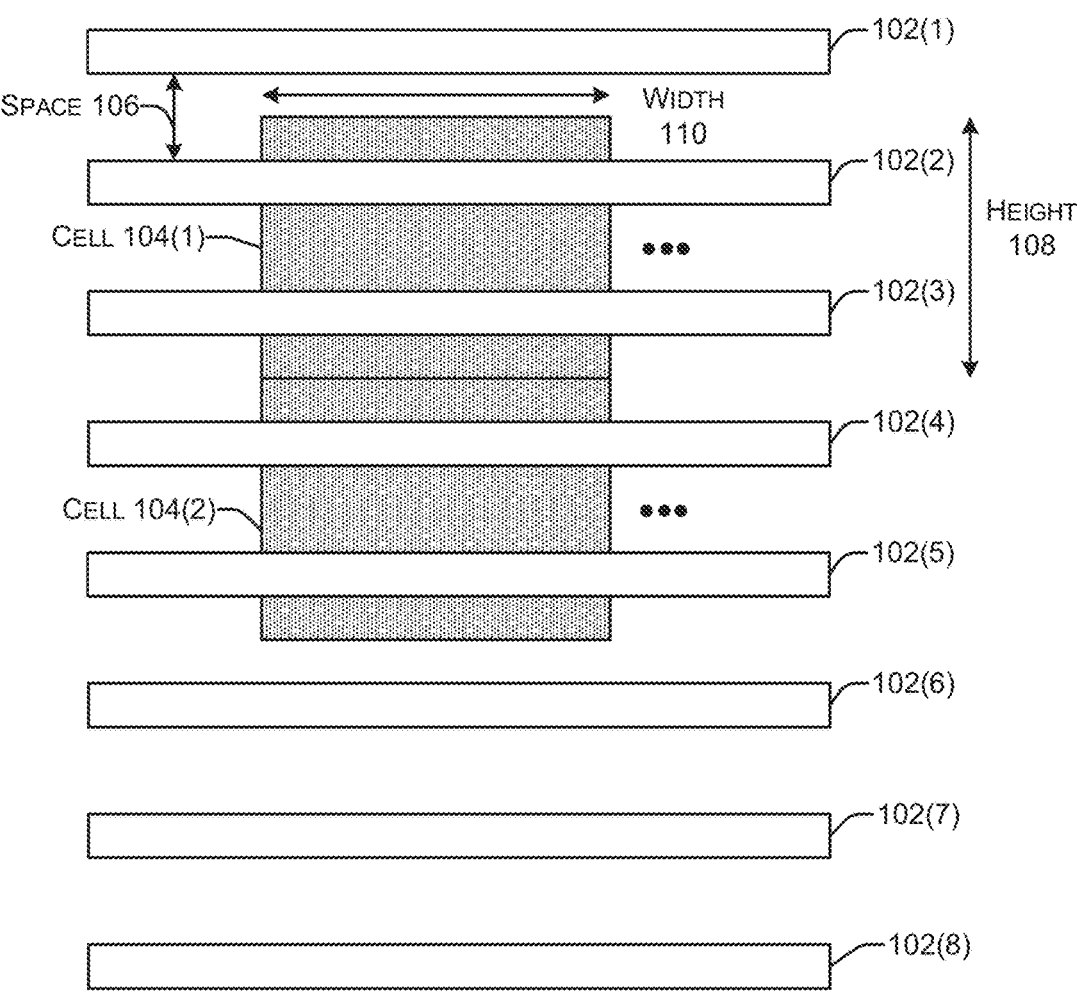
FIG. 1

200

202(1)

208

SPACE 206

DUAL 204(1)

210

DUAL 204(2)

CELL 104(1)

202(2)

212

•••

202(3)

CELL 104(2)

DUAL 204(3)

•••

DUAL 204(4)

202(4)

SPACE 206

DUAL 204(1)

SPACE 208

202(1)

SPACE 212

202(2)

CELL 104(1)

DUAL 204(2)

SPACE 210

DUAL 204(3)

CELL 104(2)

202(3)

202(3)

DUAL 204(4)

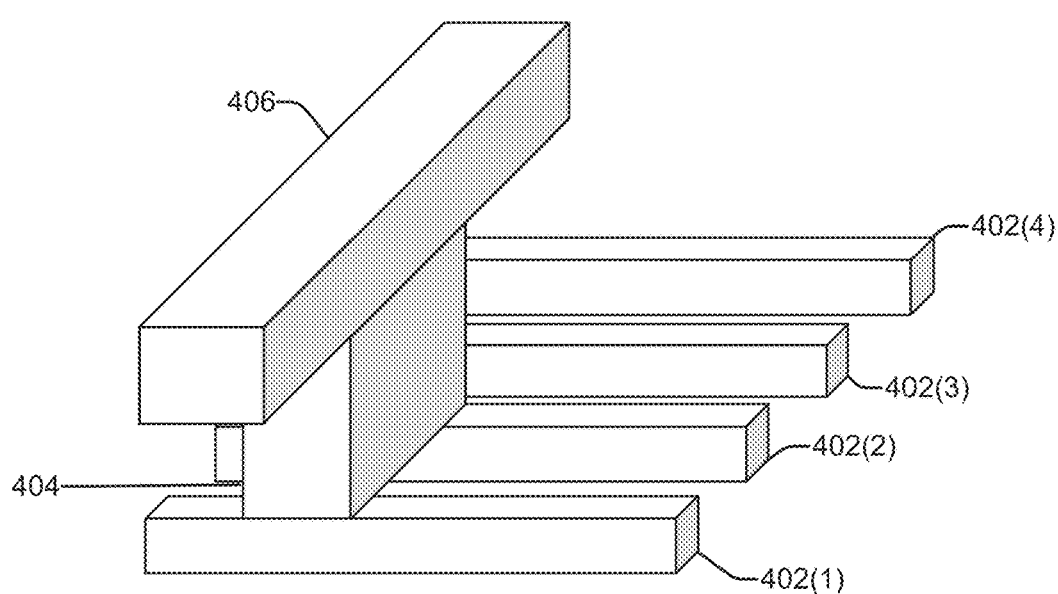
FIG. 4

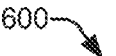
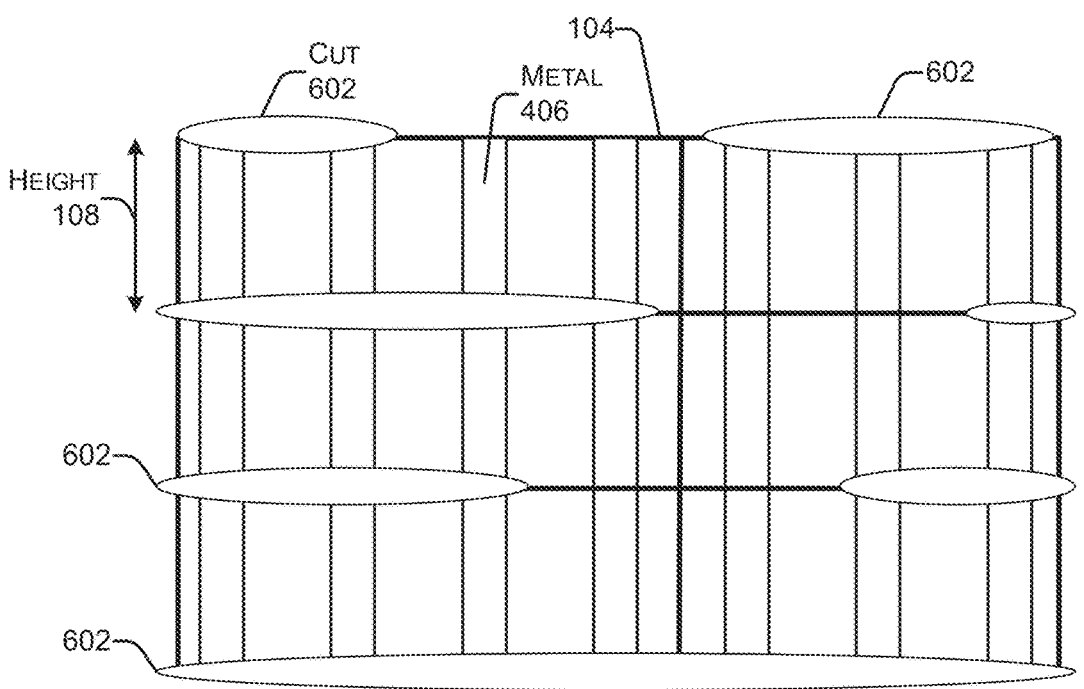
FIG. 6

Figures 11A, 11B:
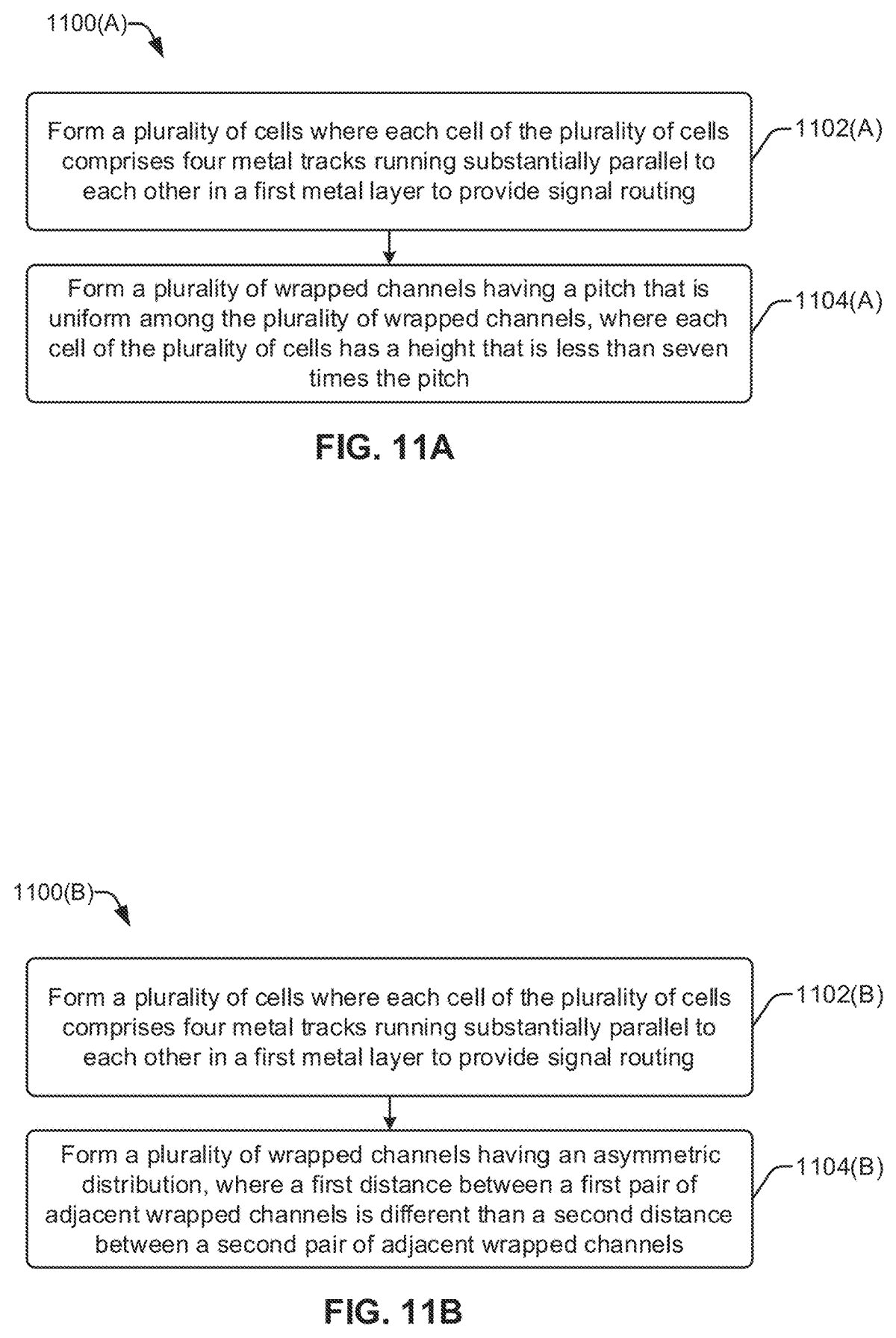

1100(A)

| |
|---|
| Form a plurality of cells where each cell of the plurality of cells comprises four metal tracks running substantially parallel to each other in a first metal layer to provide signal routing |

— 1102(A)

| |
|---|
| Form a plurality of wrapped channels having a pitch that is uniform among the plurality of wrapped channels, where each cell of the plurality of cells has a height that is less than seven times the pitch |

| |
|---|
| Form a plurality of cells where each cell of the plurality of cells comprises four metal tracks running substantially parallel to each other in a first metal layer to provide signal routing |

— 1102(B)

| |
|---|
| Form a plurality of wrapped channels having an asymmetric distribution, where a first distance between a first pair of adjacent wrapped channels is different than a second distance between a second pair of adjacent wrapped channels |

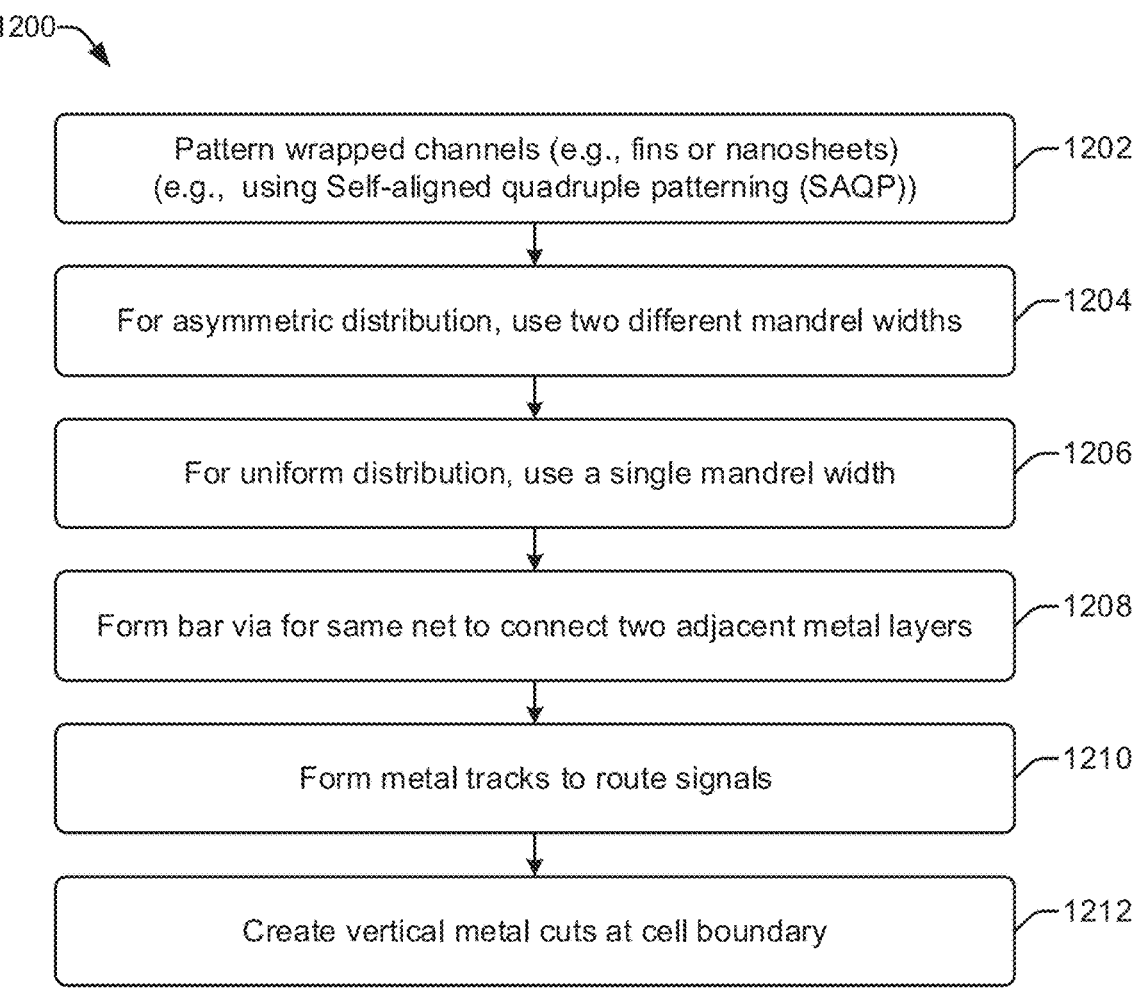

Pattern wrapped channels (e.g., fins or nanosheets)
(e.g., using Self-aligned quadruple patterning (SAQP)) ⟵1202

For asymmetric distribution, use two different mandrel widths ⟵1204

For uniform distribution, use a single mandrel width ⟵1206

Form bar via for same net to connect two adjacent metal layers ⟵1208

Form metal tracks to route signals ⟵1210

Create vertical metal cuts at cell boundary ⟵1212

FIG. 12

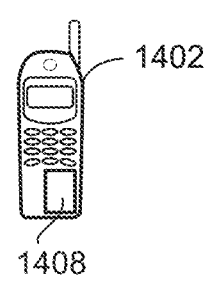
1402
1408
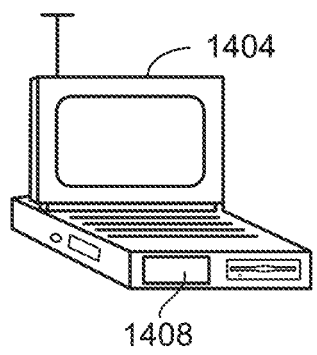
1404
1408
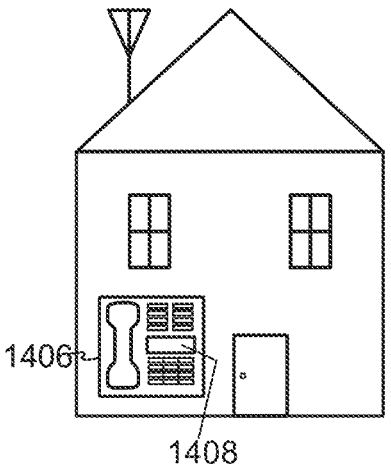
1406
1408
FIG. 14

CELL ARCHITECTURE FOR A SEMICONDUCTOR DEVICE

BACKGROUND OF THE DISCLOSURE

1. Field of the Disclosure

Aspects of this disclosure relate generally to an integrated circuit (IC), and particularly to an ultra-high density standard cell architecture.

2. Description of the Related Art

In a semiconductor device (also known as a chip or integrated circuit (IC)), cell heights are decreasing, resulting in increased cell density.

SUMMARY

The following presents a simplified summary relating to one or more aspects disclosed herein. As such, the following summary should not be considered an extensive overview relating to all contemplated aspects, nor should the following summary be regarded to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In a first aspect, a semiconductor device includes a plurality of cells. Each cell of the plurality of cells includes four metal tracks running substantially parallel to each other in a first metal layer to provide signal routing and a plurality of wrapped channels having a pitch that is uniform among the plurality of wrapped channels.

In a second aspect, a semiconductor device includes a plurality of cells. Each cell of the plurality of cells includes four metal tracks running substantially parallel to each other in a first metal layer to provide signal routing and a plurality of wrapped channels having an asymmetric distribution. For example, a first distance between a first pair of adjacent wrapped channels is different than a second distance between a second pair of adjacent wrapped channels.

In a third aspect, a method of fabricating a semiconductor device includes forming a plurality of cells, with each cell of the plurality of cells including four metal tracks running substantially parallel to each other in a first metal layer to provide signal routing. The method includes forming a plurality of wrapped channels having a pitch that is uniform among the plurality of wrapped channels.

In a fourth aspect, a method of fabricating a semiconductor device includes forming a plurality of cells, with each cell of the plurality of cells including four metal tracks running substantially parallel to each other in a first metal layer to provide signal routing. The method includes forming a plurality of wrapped channels having an asymmetric distribution in which a first distance between a first pair of adjacent wrapped channels is different than a second distance between a second pair of adjacent wrapped channels.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and are provided solely for illustration of the aspects and not limitation thereof. A more complete understanding of the present disclosure may be obtained by reference to the following Detailed Description when taken in conjunction with the accompanying Drawings. In the figures, the left-most digit(s) of a reference number identifies the figure in which the reference number first appears. The same reference numbers in different figures indicate similar or identical items.

FIG. 1 illustrates an example of a semiconductor device having an equidistant distribution of wrapped channels, according to various aspects of the disclosure.

FIG. 4 illustrates an example of a semiconductor device having a bar connecting two consecutive layers, according to various aspects of the disclosure.

FIG. 6 illustrates an example of a semiconductor device in which a vertical cut is positioned at a cell boundary, according to various aspects of the disclosure.

FIG. 11A illustrates a process that includes forming a semiconductor device having a plurality of wrapped channels with a uniform pitch, according to various aspects of the disclosure.

FIG. 11B illustrates a process that includes forming a semiconductor device having a plurality of wrapped channels with an asymmetric distribution, according to various aspects of the disclosure.

FIG. 12 illustrates a process that includes using one or two mandrel widths, according to various aspects of the disclosure.

FIG. 14 illustrates various electronic devices that may be integrated with an integrated device or a semiconductor device in accordance with one or more aspects of the disclosure.

DETAILED DESCRIPTION

Figure 2:
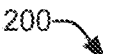
FIG. 2 illustrates a first example of a semiconductor device having an asymmetric fin distribution, according to various aspects of the disclosure.

Disclosed are systems and techniques to increase the density of a standard cell architecture for cells used in a semiconductor device. As a first example, self-aligned quadruple patterning (SAQP) may be used with a 107 nanometer (nm) mandrel and a fin pitch of 27 nm. In some aspects, equidistant fins may be used to provide uniform fin distribution across the cell. In other aspects, single fins and dual fins may be both used with two different mandrel widths to provide asymmetric fin distribution. As a second example, 4 metal routing tracks (e.g., instead of 5) may be used in a standard cell to reduce the height (H) of the standard cell, thereby creating a smaller standard cell. As a third example, two adjacent fins are combined into a single fin to increase density. As a fourth example, first vertical metal cuts are aligned on cell boundaries to access a first metal layer or a second metal layer. As a fifth example, a bar via (e.g., metal 2 layer) for a same net may be used to tap two consecutive (e.g., adjacent) metal layers that are running parallel to each other. Of course, one or more of these techniques may be combined to achieve an ultra-high density standard cell architecture.

Aspects of the disclosure are provided in the following description and related drawings directed to various examples provided for illustration purposes. Alternate aspects may be devised without departing from the scope of the disclosure. Additionally, well-known elements of the disclosure will not be described in detail or will be omitted so as not to obscure the relevant details of the disclosure.

The words "example" and/or "example" are used herein to mean "serving as an example, instance, or illustration." Any aspect described herein as "example" and/or "example" is not necessarily to be construed as preferred or advantageous over other aspects. Likewise, the term "aspects of the disclosure" does not require that all aspects of the disclosure include the discussed feature, advantage or mode of operation.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, the sequence(s) of actions described herein can be considered to be embodied entirely within any form of non-transitory computer-readable storage medium having stored therein a corresponding set of computer instructions that, upon execution, would cause or instruct an associated processor of a device to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

FIG. 1 illustrates an exemplary semiconductor device 100 having an equidistant distribution of wrapped channels, according to various aspects of the disclosure. As used herein, the term wrapped channel refers to either (i) a nanosheet that has a gate wrapped around a channel in a Gate All Around (GAA) configuration or (ii) a fin that has a gate wrapped around a channel on 3 sides (e.g., a trigate fin).

The fins are built on a substrate on which silicon is etched into a fin shaped body of the transistor. A gate is wrapped around and over the fin, which also acts as the transistor's channel. A nanosheet is a two-dimensional nanostructure with thickness in a scale ranging from 1 to 100 nm. Nanosheets may be used using Silicon, Graphene, or similar materials. In some aspects, when nanosheets are used in an asymmetric configuration, a narrow nanosheet may be used for a P metal oxide semiconductor (PMOS) and a wide nanosheet may be used for an N metal oxide semiconductor (NMOS) or vice-versa (e.g., a narrow nanosheet may be used for NMOS and a wide nanosheet may be used for PMOS). In some aspects, in the case of fins, one fin may be used for PMOS and 2 fins may be used for NMOS or one fin may be used for NMOS and 2 fins may be used for PMOS. The narrow nanosheet may be between about 16 nanometers (nm) wide to about 27 nm wide, while the wide nanosheet may be approximately 1.5 times, 2 times, or 2.5 times as wide as the narrow nanosheet. Thus, the wide nano sheet may vary in width from about 24 nm to about 68 nm.

FIG. 1 illustrates a top view of the semiconductor device 100. In FIG. 1, multiple wrapped channels 102 are distributed in such a way that adjacent wrapped channels 102 (e.g., 102(1) and 102(2)) have a same distance, e.g., a space 106, between them. In some aspects, the space 106 may be about 60 nanometers (nm). The semiconductor device 100 includes multiple standard cells 104, with each standard cell having two wrapped channels 102. For example, the standard cell 104(1) has associated wrapped channels 102(2), 102(3) and standard cell 104(2) has associated wrapped channels 102(4), 102(5).

In some aspects, the wrapped channels 102 may be an active region, such as a P metal oxide semiconductor (MOS) or an NMOS. For example, in one aspect, 102(1) is a PMOS fin or nanosheet, 102(2) is a PMOS fin or nanosheet, 102(3) is an NMOS fin or nanosheet, 102(4) is an NMOS fin or nanosheet, 102(5) is a PMOS fin or nanosheet, 102(6) is a PMOS fin or nanosheet, 102(7) is an NMOS fin or nanosheet, and 102(8) is an NMOS fin or nanosheet. In the semiconductor device 100, a single one of the wrapped channels 102 may replace dual fins (as found in a conventional semiconductor device). Thus, each standard cell 104 has two associated wrapped channels (rather than 4 fins as in a conventional semiconductor device).

In some aspects, each standard cell 104 has a height 108 of about 162 mm (as compared to a conventional cell that has a height of about 200 nm) and a width 110 of about 270 nm. However, it will be appreciated that these values are merely provided for illustration and the various aspects disclosed are not limited to these specific values, but instead generally provide various aspects that allow for reduced cell height and width for various designs. In some aspects, patterning each of the wrapped channels 102 may be performed using self-aligned quadruple patterning (SAQP). For example, a mandrel with a 107 nanometer (nm) spacing may be used to provide a uniform pitch size of 27 nm. The fin pitch is the sum of the fin width and the space between two adjacent fins. In FIG. 1, the cell height 108 (e.g., 162 nm) is less than 7 times the fin pitch (e.g., 27 nm). A technical advantage of using a uniform fin spacing is that a single mandrel can be used during formation of the semiconductor device, resulting in an improved yield.

FIG. 2 illustrates a first example of a semiconductor device 200 having an asymmetric fin distribution, according to various aspects of the disclosure. FIG. 2 illustrates a horizontal cross-section of the semiconductor device 200 viewed from above. The semiconductor device 200 has a mixture of a single fin 202 and dual fins 204. The semiconductor device 200 includes multiple standard cells 104, with each of the standard cells 104 having the single fins 202 and the dual fins 204.

Each of 202 and 204 may be an active region, such as a PMOS or an NMOS. In one aspect, 202 are NMOS fins and 204 are PMOS fins. For example, 202(1) is an NMOS fin, 204(1) are PMOS fins, 204(2) are PMOS fins, 202(2) is an NMOS fin, 202(3) is an NMOS fin, 204(3) are PMOS fins, 204(4) are PMOS fins, and 202(4) is an NMOS fin. In some aspects, a space 208 between the fin 202(1) and the dual fins 204(1), a space 210 between the dual fins 204(1) and the dual fins 204(2), and a space 212 between the fin 202(2) and the fin 202(3) may be the same, while in other aspects, one or more of the spaces 208, 210, 212 may be different from the others. Each of the spaces 208, 210, 212 may vary between about 40 nm to 80 nm. For example, in some aspects, the space 208 may be 60 nm, the space 210 may be 70 nm, and the space 212 may be 80 nm.

Figure 3:
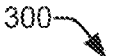
FIG. 3 illustrates a second example of a semiconductor device having an asymmetric fin distribution, according to various aspects of the disclosure.

FIG. 3 illustrates a second example of a semiconductor device 300 having an asymmetric fin distribution, according to various aspects of the disclosure. FIG. 3 illustrates a horizontal cross-section of the semiconductor device 300 viewed from above. The semiconductor device 300 has a mixture of the single fin 202 and the dual fins 204. The dual fins 204 has the space 206 between each fin. The semiconductor device 300 includes multiple cells 104, with each cell having the fin 202 and the dual fins 204.

Each of the fins 202 and the dual fins 204 may be an active region, such as a PMOS or an NMOS. In an aspect, each of 202 may be PMOS fins and each of the dual fins 204 may be NMOS fins. For example, in one aspect, the dual fins 204(1) are NMOS fins, 202(1) is a PMOS fin, 202(2) is a PMOS fin, 204(2) are NMOS fins, 204(3) are NMOS fins, 202(3) is a PMOS fin, 202(4) is a PMOS fin, and 204(4) are NMOS fins.

The semiconductor device 300 includes the space 208 between the dual fins 204(1) and the fin 202(1), the space 210 between the dual fins 204(2) and the dual fins 204(3), and the space 212 between the fin 202(1) and the fin 202(2). In some aspects, the spaces 208, 210, 212 may be the same distance while in other aspects, one or more of the spaces 208, 210, 212 may be different from the others.

A technical advantage of the asymmetric fin distribution illustrated in FIG. 2 and FIG. 3 includes providing a wide channel width for better performance asymmetrically on rise and fall transitions (e.g., as compared to uniformly distributed fins or the narrowest width nanosheet). A further technical advantage is providing a lower standard cell height while also providing an asymmetric architecture where two fins (or a wide width nanosheet) can be used to mitigate performance gaps.

FIG. 4 illustrates an exemplary semiconductor device 400 having a bar via connecting two consecutive layers, according to various aspects of the disclosure. Two consecutive (e.g., adjacent) metal tracks 402 (e.g., 402(1), 402(2), 402(3) and 402(4)) at a same level in metal layer (e.g., M1/M0), metal track 402(1) and metal track 402(2), are connected using a single bar via 404. In some aspects, the single bar via 404 may be rectangular-shaped on at least 4 sides. The single bar via 404 may be connected to a higher-level metal layer (e.g., M2/M1), such as metal layer 406, that is orthogonal to the metal track 402. For example, a hole may be cut in the higher-level metal layer 406 and a metal sputtered to create the bar via 404 that electrically connects consecutive metal track 402(1) to metal track 402(2). A technical advantage of such an arrangement includes providing better routing ("routability") and pin access for ultra-low standard cell heights.

Figure 5:
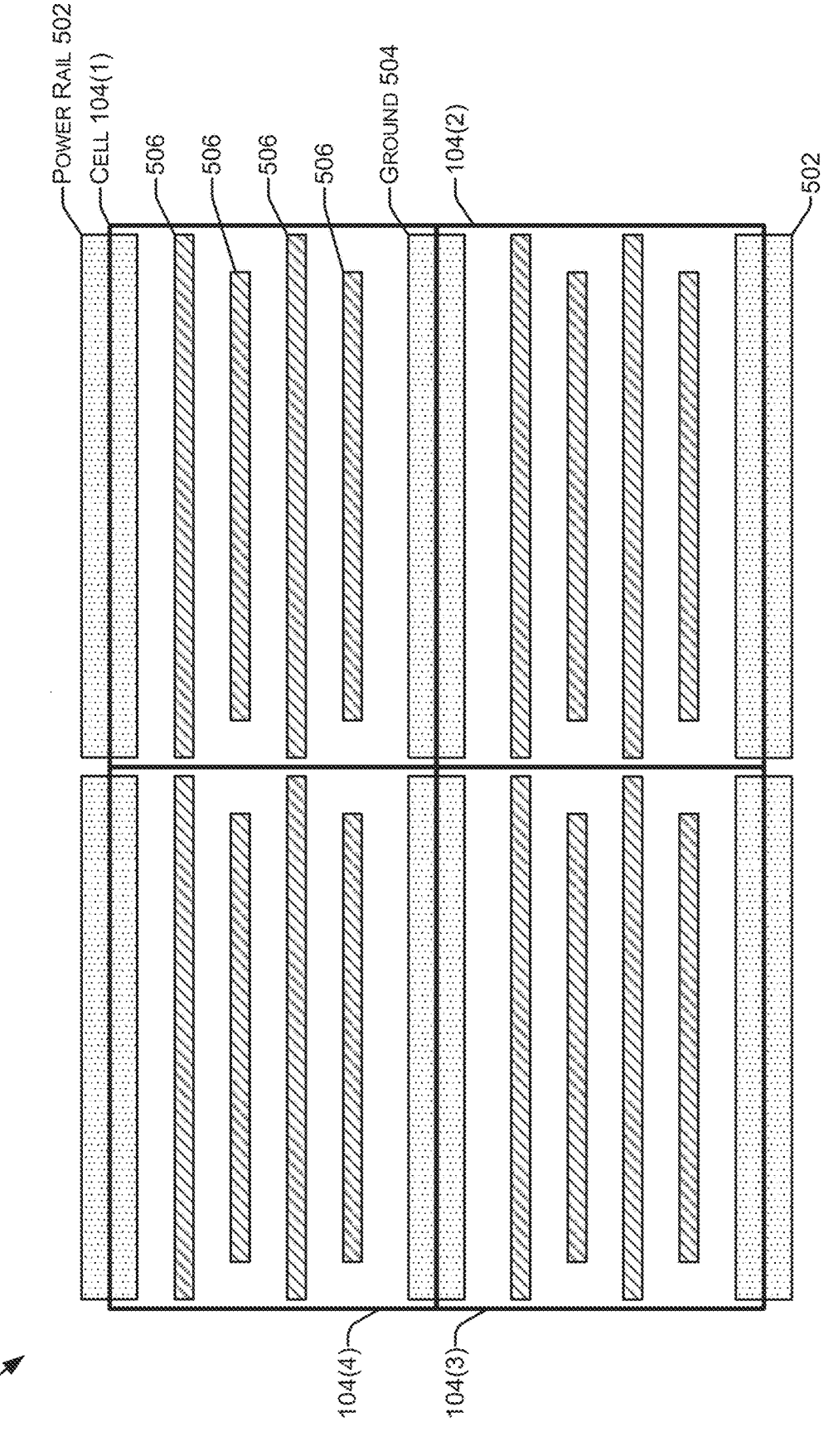
FIG. 5 illustrates an example of a semiconductor device that includes metal tracks to route signals, according to various aspects of the disclosure.

FIG. 5 illustrates an exemplary semiconductor device 500, including tracks to route signals, according to various aspects of the disclosure. FIG. 5 illustrates a top view of four standard cells 104, labeled 104(1), 104(2), 104(3) and 104 (4), as described herein. A power rail 502 (e.g., VDD) is located on a boundary of each of the standard cell 104(1) and the standard cell 104(2) and a ground 504 is located on a common boundary between the standard cell 104(1) and the standard cell 104(2). Four metal tracks 506 are located in each of the standard cells 104 and may be used for signal routing. In contrast, a conventional cell may use at least 5 metal tracks for signal routing. The power rail 502 may have a reduced height compared to a conventional power rail. For example, the power rail 502 may have a height of 36 nm (as compared to 46 nm for a conventional cell) due to the reduced power consumption caused by the reduced fin size. A technical advantage of using the four metal tracks 506 over conventional designs is that, as the height of each of the standard cells 104 is reduced (e.g., from 200 nm to 162 nm), the four metal tracks 506 provide reduced semiconductor device height, increased transistor density, or both.

FIG. 6 illustrates an exemplary semiconductor device 600 in which a vertical cut is positioned at a cell boundary, according to various aspects of the disclosure. In the semiconductor device 600, vertical cuts 602 are aligned to horizontal boundaries of each of the standard cells 104 (six cells are illustrated in FIG. 6). The vertical cuts 602 may be a single cut or a merged cut. A merged cut is a horizontal cut that includes 2 adjacent vertical layers. A technical advantage of the cuts 602 includes enabling access to metal layer 406 to provide signal routing between cells.

Figure 7:
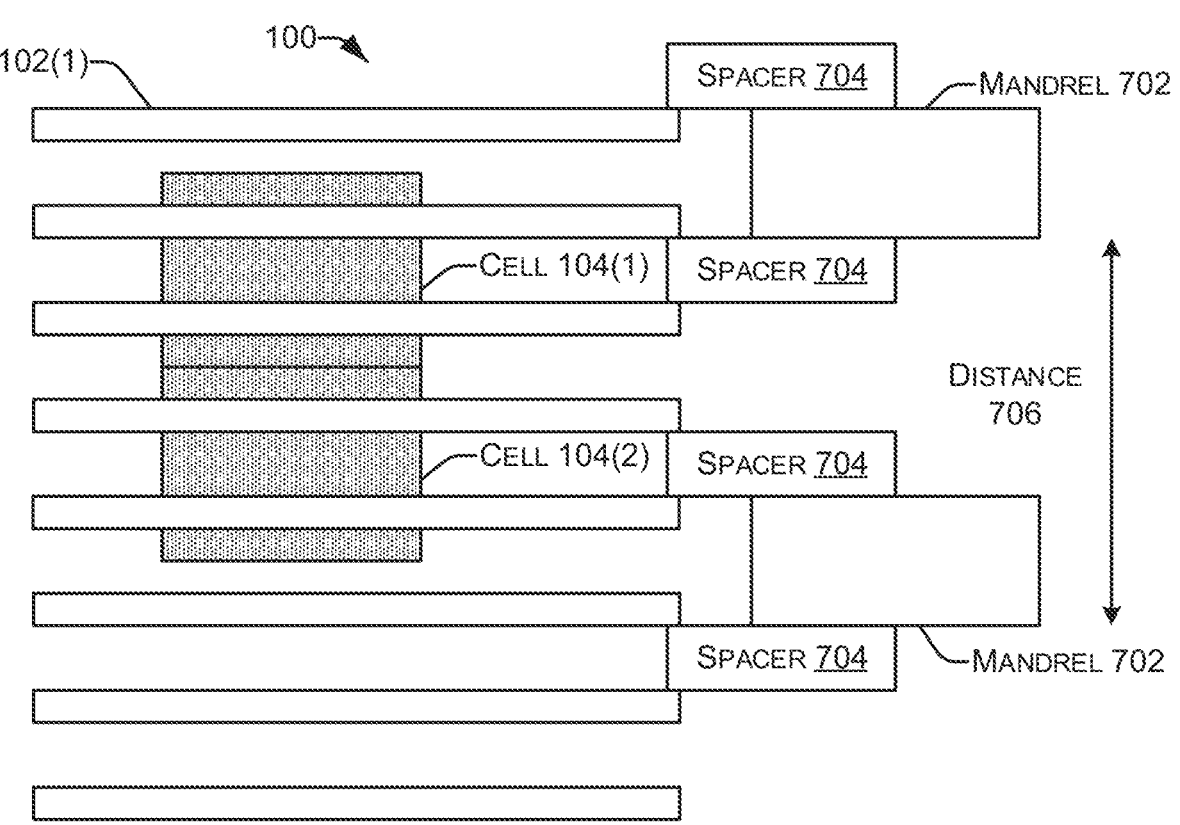
FIG. 7 illustrates using a mandrel to pattern an equidistant distribution of wrapped channels, according to various aspects of the disclosure.

FIG. 7 illustrates using a mandrel to pattern an equidistant distribution of wrapped channels, according to various aspects of the disclosure. During manufacturing, a mandrel 702 with spacers 704 may be used to create the semiconductor device 100 having the equidistant distribution of wrapped channels. For example, in an aspect, self-aligned quadruple patterning (SAQP) may be used with the mandrel 702 having a 107 nanometer (nm) spacing to provide a uniform pitch size of 27 nm. In some aspects, a distance 706 between the mandrels 702 may be about 107 nm. A technical advantage of patterning an equidistant distribution of wrapped channels is that a single mandrel can be used during formation of the semiconductor device, resulting in an improved yield.

Figure 8:
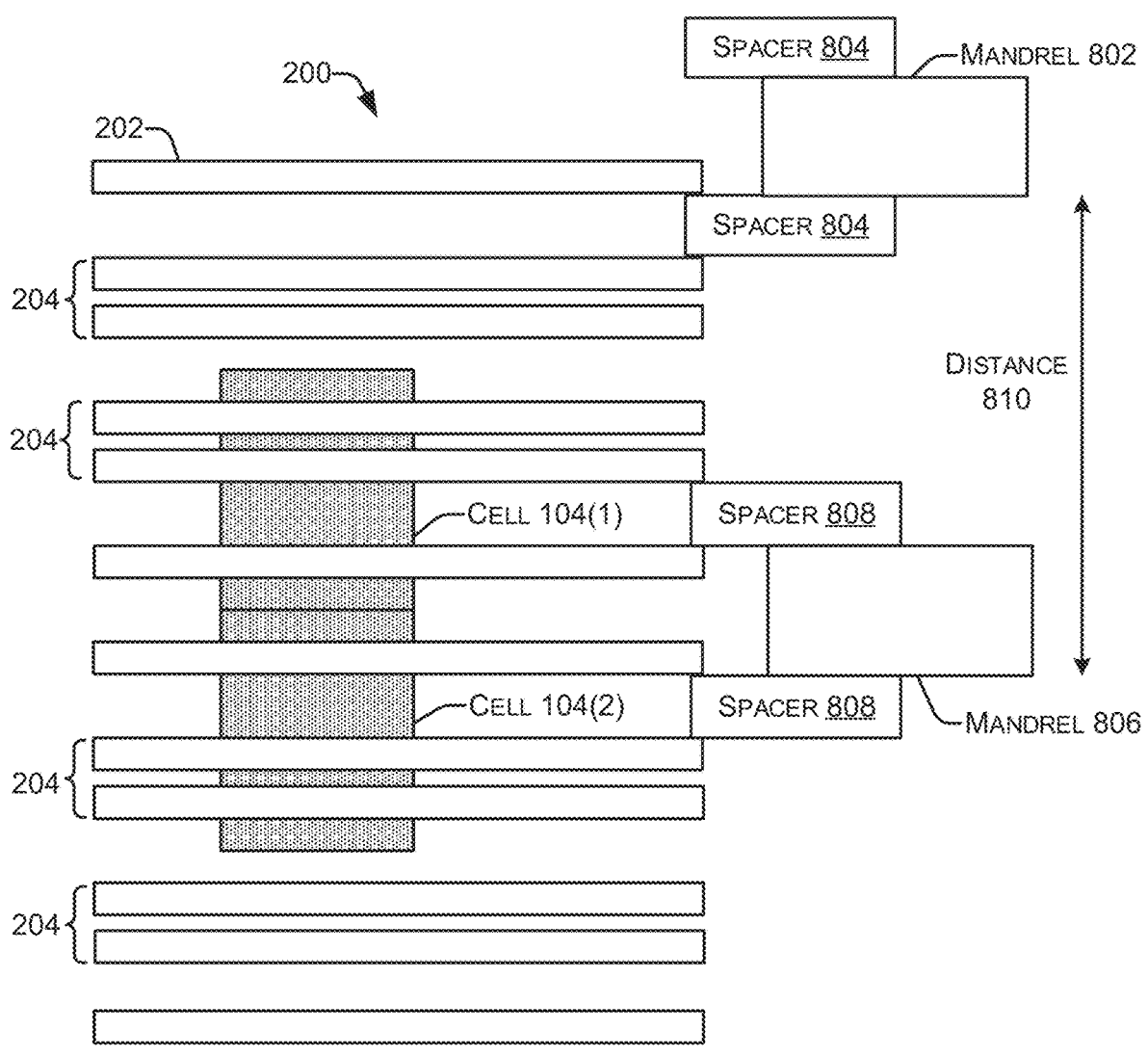
FIG. 8 illustrates using a mandrel to pattern an asymmetric distribution of wrapped channels, according to various aspects of the disclosure.

FIG. 8 illustrates using a mandrel to pattern an asymmetric distribution of wrapped channels, according to various aspects of the disclosure. During manufacturing, a mandrel 802 with spacers 804 and a mandrel 806 with spacers 808 may be used to create the semiconductor device 200 (or the semiconductor device 300) having the asymmetric distribution of wrapped channels. The spacer 804 may, in some aspects, have a different width than the spacer 808 to enable the spaces 208, 210, 212 of FIG. 2. For example, self-aligned quadruple patterning (SAQP) may be used with the mandrels 802, 806 having 119 nanometer (nm) spacing. In some aspects, a distance 810 between the mandrels 802, 806 may be about 162 nm. A technical advantage of patterning an asymmetric fin distribution includes providing a wide channel width for better performance asymmetrically on rise and fall transitions (e.g., as compared to uniformly distributed fins or the narrowest width nanosheet). A further technical advantage is providing a lower standard cell height while also providing an asymmetric architecture where two fins (or a wide width nanosheet) can be used to mitigate performance gaps.

Figure 9:
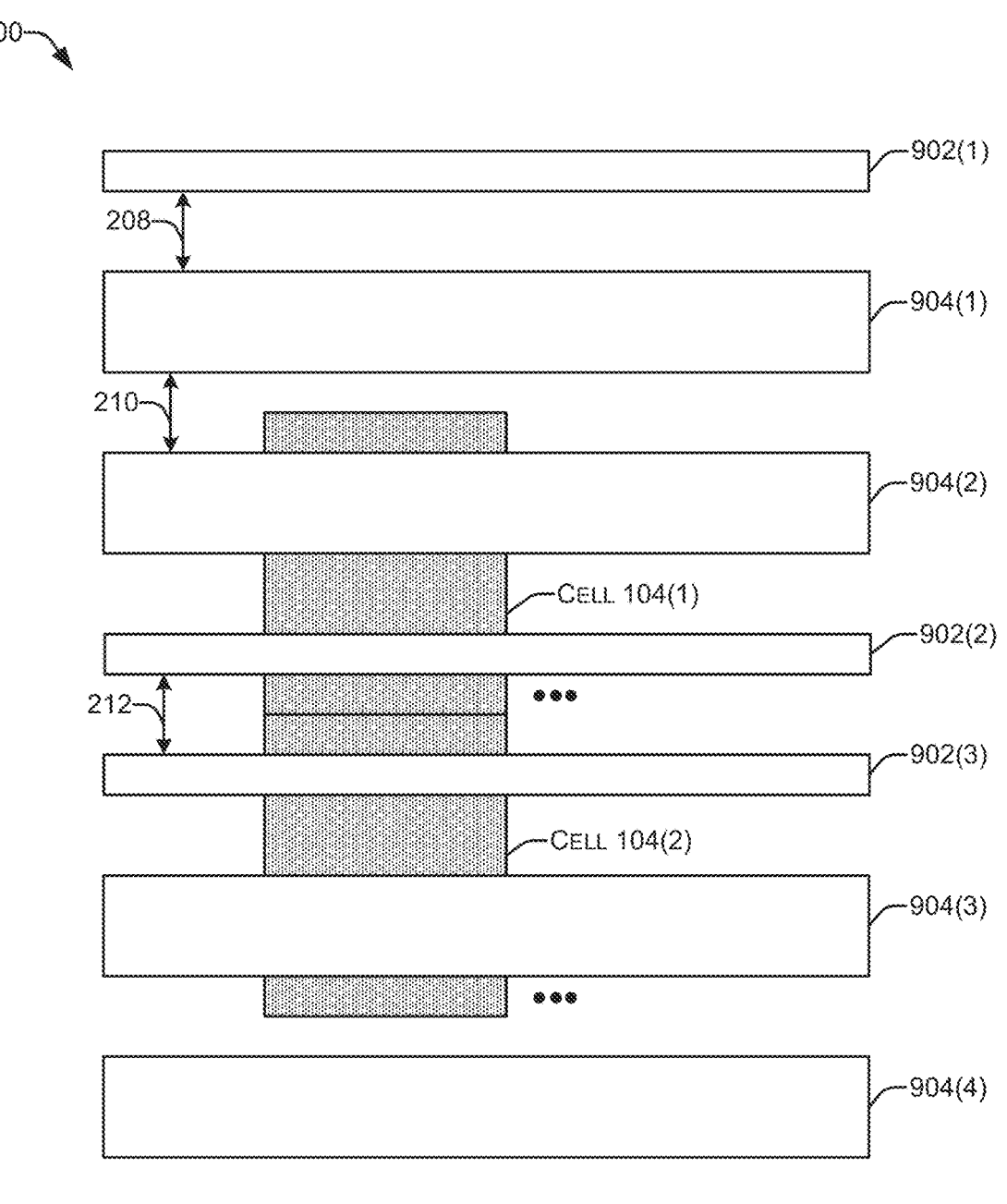
FIG. 9 illustrates an example of a semiconductor device having an asymmetric nanosheet distribution, according to various aspects of the disclosure.

FIG. 9 illustrates an exemplary semiconductor device 900 having an asymmetric nanosheet distribution, according to various aspects of the disclosure. FIG. 9 illustrates a horizontal cross-section of the semiconductor device 200 viewed from above. The semiconductor device 900 has one or more narrow nanosheets, such as representative narrow nanosheets 902(1), 902(2), 902(3), 902(4) and one or more wide nanosheets, such as representative wide nanosheets 904(1), 904(2), 904(3), 904(4). In the semiconductor device 900, the wrapped channel has a nanosheet that has a gate wrapped around a channel in a Gate All Around (GAA) configuration. When nanosheets 902, 904 are used in an asymmetric configuration, as shown in FIG. 9, in some aspects the narrow nanosheets 902(1), 902(2), 902(3), 902 (4) may be used for PMOS and the wide nanosheets 904(1), 904(2), 904(3), 904(4) may be used for NMOS, while in other aspects, the narrow nanosheets 902(1), 902(2), 902(3), 902(4) may be used for NMOS and the wide nanosheets 904(1), 904(2), 904(3), 904(4) may be used for PMOS. In some aspects, the narrow nanosheets 902 may have a width of about 16-27 mm and the wide nanosheets 904 may have a width of 1.5 times, 2.0 times, or 2.5 times the width of the narrow nanosheets 902. The semiconductor device 900 may have the space 208 between the narrow nanosheet 902(1) and the wide nanosheet 904(1), the space 210 between the wide nanosheet 904(1) and the wide nanosheet 904(2), and the space 212 between the narrow nanosheet 902(2) and the narrow nanosheet 902(3). In some aspects, the spaces 208, 210, 212 may be the same, while in other aspects, one or more of the spaces 208, 210, 212 may be different from each other. A technical advantage of an asymmetric nanosheet distribution includes providing a wide channel width for better performance asymmetrically on rise and fall transitions (e.g., as compared to uniformly distributed fins or the narrowest width nanosheet). A further technical advantage is providing a lower standard cell height while also providing an asymmetric architecture where a wide width nanosheet can be used to mitigate performance gaps.

Figure 10A:
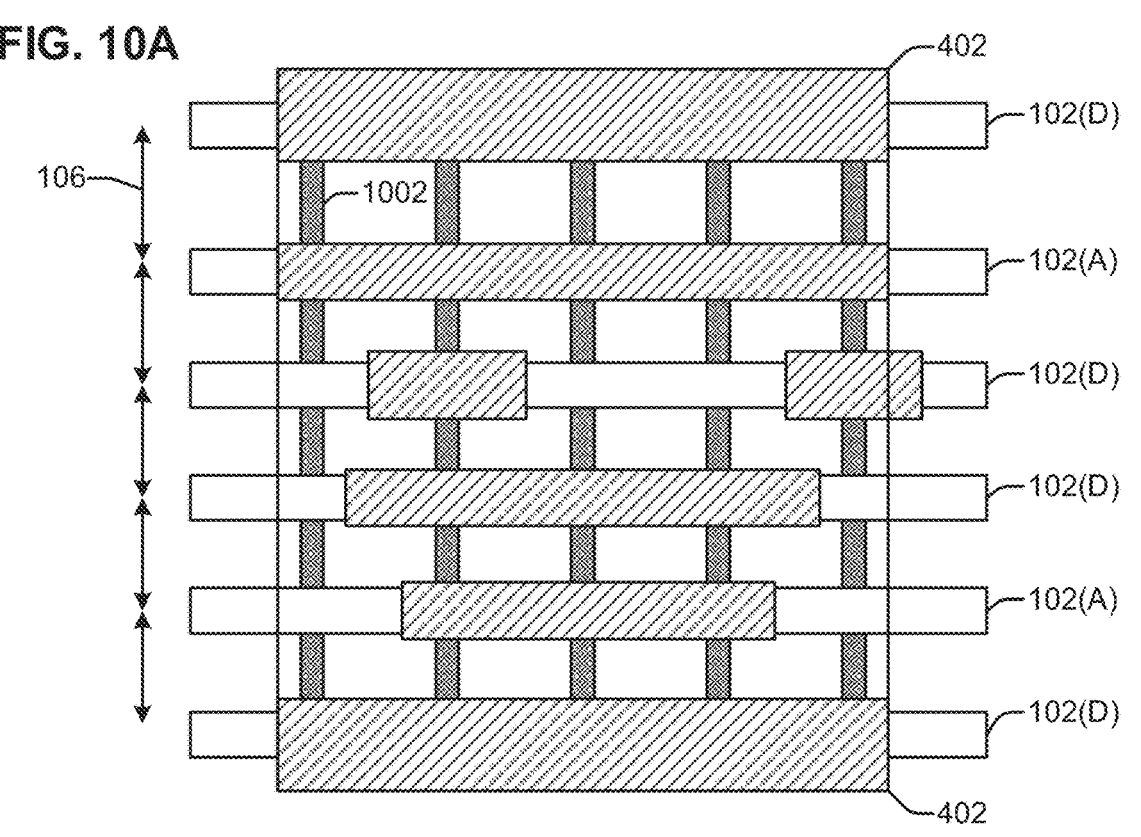
FIG. 10A illustrates a top view cross section of semiconductor device having an equidistant distribution of fins, according to various aspects of the disclosure.

FIG. 10A illustrates a top view (e.g., cross section) of semiconductor device having an equidistant distribution of fins, according to various aspects of the disclosure. The semiconductor device includes both dummy fins, 102(D), and active fins 102(A) with the space 106 between two adjacent fins 102. The semiconductor device includes multiple gates 1002 and metal tracks 402.

Figure 10B:
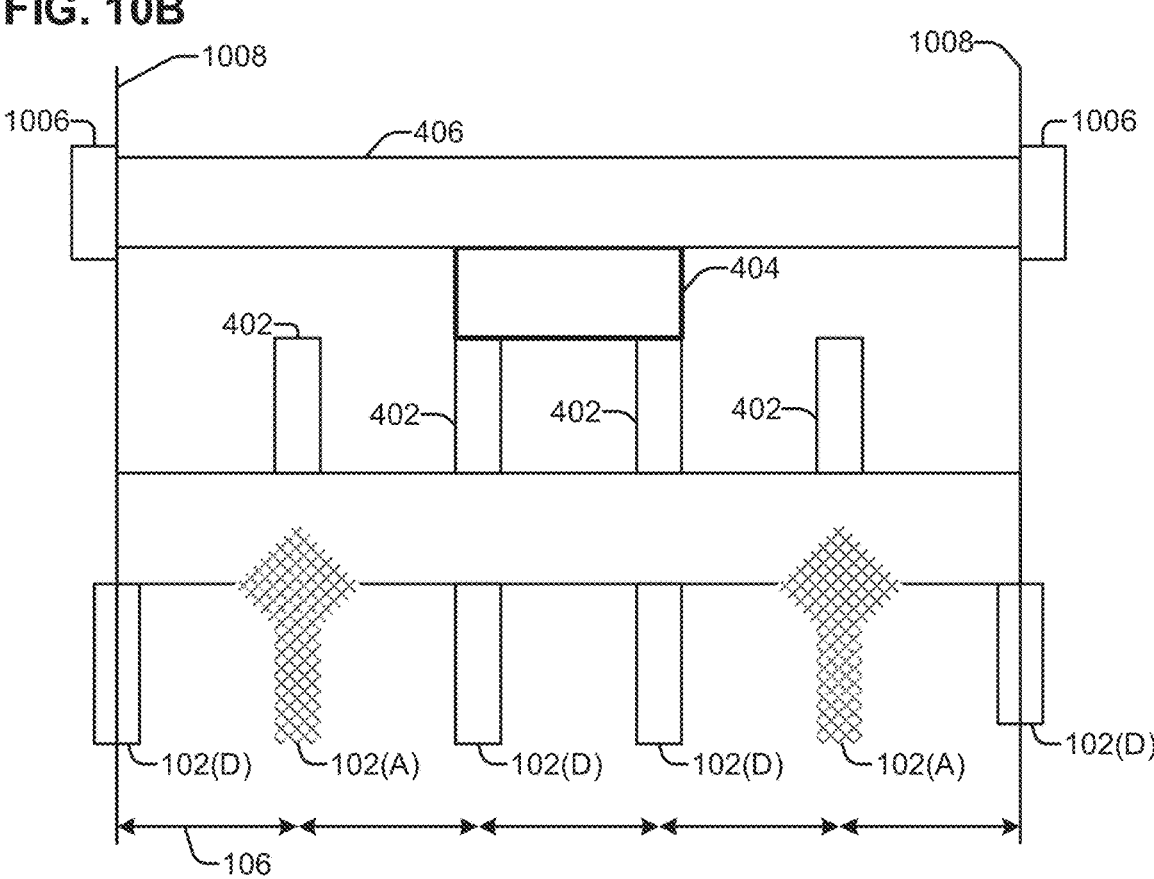
FIG. 10B illustrates a side view cross section of semiconductor device having an equidistant distribution of fins, according to various aspects of the disclosure.

FIG. 10B illustrates a side view (e.g., cross section) of a semiconductor device having an equidistant distribution of fins, according to various aspects of the disclosure. The semiconductor device includes both dummy fins, 102(D), and active fins 102(A) with an equidistant spacing (e.g., the space 106) between two adjacent fins 102. The semiconductor device includes multiple gates 1002 as well as the first metal layer 402 and the second metal layer 406, connected by the single bar via 404. Cuts 1006 to the second metal layer 406 are aligned with cell boundaries 1006.

In the flow diagrams of FIGS. 11A, 11B, and 12, each block represents one or more operations that can be implemented in hardware, software, or a combination thereof. In the context of software, the blocks represent computer-executable instructions that, when executed by one or more processors, cause the processors to perform the recited operations. Generally, computer-executable instructions include routines, programs, objects, modules, components, data structures, and the like that perform particular functions or implement particular abstract data types. The order in which the blocks are described is not intended to be construed as a limitation, and any number of the described operations can be combined in any order and/or in parallel to implement the processes. For discussion purposes, the processes 1100(A), 1100(B), and 1200 are described with reference to FIGS. 1, 2, 3, 4, 5, 6, 7, 8, 9, and 10 as described above, although other models, frameworks, systems and environments may be used to implement these processes.

FIG. 11A illustrates a process 1100(A) that includes forming a semiconductor device having a plurality of wrapped channels with a uniform pitch, according to various aspects of the disclosure. The process 1100(A) may be performed as part of a semiconductor device manufacturing process.

At 1102(A), a plurality of cells is formed, where each cell of the plurality of cells comprises four metal tracks running substantially parallel to each other in a first metal layer to provide signal routing. For example, as illustrated in FIG. 5, the cells 104 are formed with the four metal tracks 506 that run substantially parallel to each other in each cell 104 to provide signal routing.

At 1104(A), a plurality of wrapped channels having a pitch that is uniform among the plurality of wrapped channels are formed, where each cell of the plurality of cells has a height that is less than seven times the pitch. For example, in FIGS. 1 and 7, the wrapped channels 102 having the uniform pitch and the height 108 that is less than seven times the pitch are formed.

When the wrapped channels have a uniform distribution, a technical advantage is that a single mandrel can be used during formation of the semiconductor device, resulting in an improved yield. A technical advantage of using the four metal tracks over conventional designs is that, as the height of each of the standard cells is reduced, the four metal tracks provide reduced semiconductor device height, increased transistor density, or both.

FIG. 11B illustrates a process 1100(B) that includes forming a semiconductor device having a plurality of wrapped channels with an asymmetric distribution, according to various aspects of the disclosure. The process 1100(B) may be performed as part of a semiconductor device manufacturing process.

At 1102(B), a plurality of cells is formed, where each cell of the plurality of cells comprises four metal tracks running substantially parallel to each other in a first metal layer to provide signal routing. For example, as illustrated in FIG. 5, the cells 104 are formed with the four metal tracks 506 that run substantially parallel to each other in each cell 104 to provide signal routing.

At 1104(B), a plurality of wrapped channels having an asymmetric distribution are formed, where a first distance between a first pair of adjacent wrapped channels is different than a second distance between a second pair of adjacent wrapped channels. For example, as illustrated in FIGS. 2, 3, and 8, the wrapped channels 202, 204 may be formed. As another example, FIG. 9 illustrates nanosheets 902, 904 having an asymmetric distribution.

When the wrapped channels have an asymmetric distribution, a technical advantage includes providing a wide channel width for better performance asymmetrically on rise and fall transitions (e.g., as compared to uniformly distributed fins or the narrowest width nanosheet), providing a lower standard cell height, and providing an asymmetric architecture where two fins (or a wide width nanosheet) can be used to mitigate performance gaps. A technical advantage of using the four metal tracks over conventional designs is that, as the height of each of the standard cells is reduced, the four metal tracks provide reduced semiconductor device height, increased transistor density, or both.

FIG. 12 illustrates a process 1200 that includes using one mandrel or two mandrels, according to various aspects of the disclosure. The process 1200 may be performed as part of a semiconductor device manufacturing process.

At 1202, wrapped channels (e.g., fins or nanosheets) are patterned, e.g., using a technique such as, self-aligned quadruple patterning (SAQP). At 1204, for asymmetric wrapped channel distribution, two different mandrel widths may be used. At 1206, for uniform (e.g., equidistant) distribution, a single mandrel width may be used. For example, in FIG. 7, the mandrel 702 with the spacers 704 may be used to create uniform distribution of the wrapped channels 102. In FIG. 8, the mandrels 806 may be used to create the asymmetric distributions of the fins 202, 204 of FIG. 2 or the nanosheets 902, 904 of FIG. 9.

At 1208, a bar via is formed to connect two adjacent (e.g., consecutive) metal layers. For example, in FIG. 4, the bar via 404 is used to connect the consecutive first metal layers 402(1), 402(2) with the second metal layer 406.

At 1210, up to four metal tracks are formed to route signals. For example, in FIG. 5, the four tracks 506 are formed in each of the cells 104.

At 1212, vertical metal cuts are created that are aligned to cell boundaries. For example, the cuts 602 are aligned along vertical boundaries of the cells 104 to provide access to the metal layer 406.

When the wrapped channels have a uniform distribution, a technical advantage is that a single mandrel can be used during formation of the semiconductor device, resulting in an improved yield. When the wrapped channels have an asymmetric distribution, a technical advantage includes providing a wide channel width for better performance asymmetrically on rise and fall transitions (e.g., as compared to uniformly distributed fins or the narrowest width nanosheet), providing a lower standard cell height, and providing an asymmetric architecture where two fins (or a wide width nanosheet) can be used to mitigate performance gaps. A technical advantage of the single bar via includes providing improved routing and pin access for ultra-low standard cell heights. A technical advantage of using the four metal tracks over conventional designs is that, as the height of each of the standard cells is reduced, the four metal tracks provide reduced semiconductor device height, increased transistor density, or both. A technical advantage of the cuts includes enabling access to metal layer to provide signal routing between cells.

Figure 13:
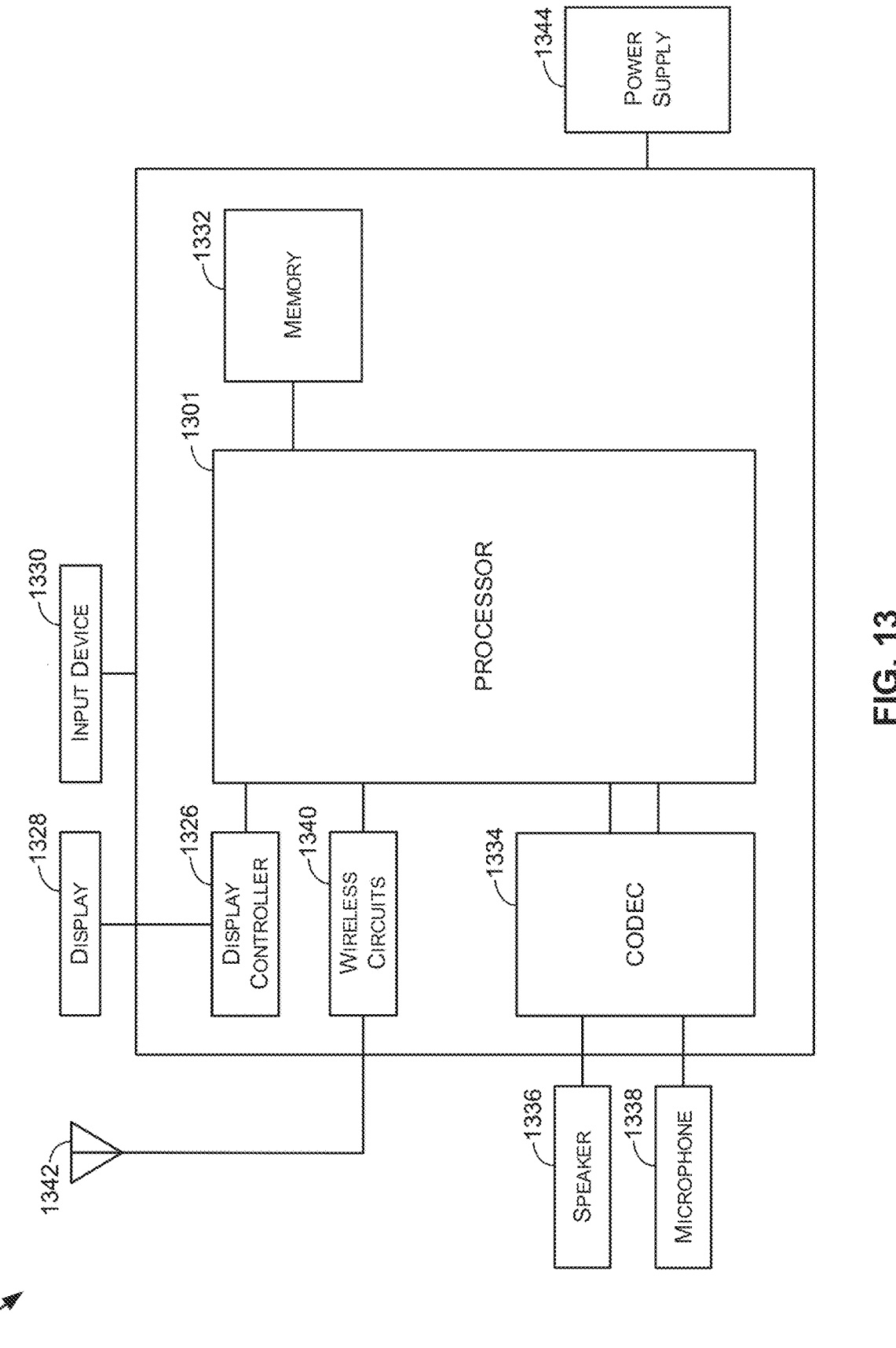
FIG. 13 illustrates an exemplary mobile device in accordance with one or more aspects of the disclosure.

FIG. 13 illustrates an exemplary mobile device 1300 in accordance with some examples of the disclosure. Referring now to FIG. 13, a block diagram of a mobile device that is configured according to exemplary aspects is depicted and generally designated mobile device 1300. In some aspects, mobile device 1300 may be configured as a wireless communication device. As shown, mobile device 1300 includes processor 1301. Processor 1301 may be communicatively coupled to memory 1332 over a link, which may be a die-to-die or chip-to-chip link. Processor 1301 is a hardware device capable of executing logic instructions. Mobile device 1300 also includes display 1328 and display controller 1326, with display controller 1326 coupled to processor 1301 and to display 1328.

In some aspects, FIG. 13 may include coder/decoder (CODEC) 1334 (e.g., an audio and/or voice CODEC) coupled to processor 1301; speaker 1336 and microphone 1338 coupled to CODEC 1334; and wireless circuits 1340 (which may include a modem, RF circuitry, filters, etc.) coupled to wireless antenna 1342 and to processor 1301.

In a particular aspect, where one or more of the above-mentioned blocks are present, processor 1301, display controller 1326, memory 1332, CODEC 1334, and wireless circuits 1340 can be implemented in whole or part using the techniques disclosed herein. Input device 1330 (e.g., physical or virtual keyboard), power supply 1344 (e.g., battery), display 1328, input device 1330, speaker 1336, microphone 1338, wireless antenna 1342, and power supply 1344 may be external to device 1300 and may be coupled to a component of device 1300, such as an interface or a controller.

It should be noted that although FIG. 13 depicts a mobile device 1300, processor 1301 and memory 1332 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

FIG. 14 illustrates various electronic devices that may be integrated with any of the aforementioned integrated device or semiconductor device accordance with various examples of the disclosure. For example, a mobile phone device 1402, a laptop computer device 1404, and a fixed location terminal device 1406 may each be considered generally user equipment (UE) and may include a semiconductor device 1408, as described herein (e.g., either with equidistant fin distribution or asymmetric fin distribution). The semiconductor device 1408 may include, for example, any of the integrated circuits, dies, integrated devices, integrated device packages, integrated circuit devices, device packages, integrated circuit (IC) packages, package-on-package devices described herein. The devices 1402, 1404, 1406 illustrated in FIG. 14 are merely exemplary. Other devices may also include electronic device 1200 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

It can be noted that, although particular frequencies, integrated circuits (ICs), hardware, and other features are described in the aspects herein, alternative aspects may vary. That is, alternative aspects may utilize additional or alternative frequencies (e.g., other the 60 GHz and/or 28 GHz frequency bands), antenna elements (e.g., having different size/shape of antenna element arrays), scanning periods (including both static and dynamic scanning periods), electronic devices (e.g., WLAN APs, cellular base stations, smart speakers, IoT devices, mobile phones, tablets, personal computer (PC), etc.), and/or other features. A person of ordinary skill in the art will appreciate such variations.

It should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements. In addition, terminology of the form "at least one of A, B, or C" or "one or more of A, B, or C" or "at least one of the group consisting of A, B, and C" used in the description or the claims means "A or B or C or any combination of these elements." For example, this terminology may include A, or B, or C, or A and B, or A and C, or A and B and C, or 2A, or 2B, or 2C, and so on.

In view of the descriptions and explanations above, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an insulator and a conductor). Furthermore, it is also intended that aspects of a clause can be included in any other independent clause, even if the clause is not directly dependent on the independent clause. Implementation examples are described in the following numbered clauses:

Clause 1. An apparatus comprising a semiconductor device comprising: a plurality of cells, wherein each cell of the plurality of cells comprises four metal tracks running substantially parallel to each other in a first metal layer to provide signal routing; and a plurality of wrapped channels having a pitch that is uniform among the plurality of wrapped channels.

Clause 2. The apparatus of clause 1, further comprising a single bar via to couple two metal tracks in the first metal layer.

Clause 3. The apparatus of any of clauses 1 to 2, further comprising a plurality of metal layer cuts, wherein each metal layer cut of the plurality of metal layer cuts is aligned with a boundary of each cell.

Clause 4. The apparatus of clause 3, wherein a metal layer cut of the plurality of metal layer cuts comprises a single cut that includes a single vertical layer.

Clause 5. The apparatus of clause 3, wherein a metal layer cut of the plurality of metal layer cuts comprises a merged cut that includes two adjacent vertical layers.

Clause 6. The apparatus of any of clauses 1 to 5, wherein each wrapped channel of the plurality of wrapped channels comprises a fin that has a gate wrapped around a channel on three sides.

Clause 7. The apparatus of any of clauses 1 to 5, wherein each wrapped channel of the plurality of wrapped channels comprises a nanosheet that has a gate wrapped around a channel in a Gate All Around (GAA) configuration.

Clause 8. The apparatus of any of clauses 1 to 7, wherein the plurality of wrapped channels includes three wrapped channels with two wrapped channels grouped together.

Clause 9. The apparatus of clause 8, wherein the two wrapped channels are grouped together as a dual wrapped channel.

Clause 10. The apparatus of any of clauses 1 to 9, wherein each wrapped channel of the plurality of wrapped channel comprises an active region.

Clause 11. The apparatus of clause 10, wherein the active region comprises one of a P-type metal oxide semiconductor or an N-type metal oxide semiconductor.

Clause 12. The apparatus of any of clauses 1 to 11, wherein each cell of the plurality of cells has a height that is less than seven times the pitch Clause 13. The apparatus of any of clauses 1 to 12, wherein the pitch is about 27 nanometers.

Clause 14. The apparatus of any of clauses 1 to 13, wherein the apparatus is selected from the group consisting of: a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, a base station, and a device in an automotive vehicle.

Clause 15. An apparatus comprising a semiconductor device comprising: a plurality of cells, wherein each cell of the plurality of cells comprises four metal tracks running substantially parallel to each other in a first metal layer to provide signal routing; and a plurality of wrapped channels having an asymmetric distribution, wherein a first distance between a first pair of adjacent wrapped channels is different than a second distance between a second pair of adjacent wrapped channels.

Clause 16. The apparatus of clause 15, further comprising a single bar via to couple two metal tracks in the first metal layer.

Clause 17. The apparatus of any of clauses 15 to 16, further comprising a plurality of metal layer cuts, each metal layer cut of the plurality of metal layer cuts aligned with a boundary of each cell.

Clause 18. The apparatus of clause 17, wherein a metal layer cut of the plurality of metal layer cuts comprises a single cut that includes a single vertical layer.

Clause 19. The apparatus of clause 17, wherein a metal layer cut of the plurality of metal layer cuts comprises a merged cut that includes two adjacent vertical layers.

Clause 20. The apparatus of any of clauses 15 to 19, wherein: each cell of the plurality of cells includes at least one narrow nanosheet and at least one wide nanosheet.

Clause 21. The apparatus of any of clauses 15 to 20, wherein a pitch between two adjacent wrapped channels of the plurality of wrapped channels is between about 24 nanometers to about 40 nanometers.

Clause 22. The apparatus of any of clauses 15 to 21, wherein the apparatus is selected from the group consisting of: a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, a base station, and a device in an automotive vehicle.

Clause 23. A method of fabricating a semiconductor device, the method comprising: forming a plurality of cells, wherein each cell of the plurality of cells comprises four metal tracks running substantially parallel to each other in a first metal layer to provide signal routing; and forming a plurality of wrapped channels having a pitch that is uniform among the plurality of wrapped channels.

Clause 24. The method of clause 23, further comprising forming a single bar via to couple two metal tracks in the first metal layer.

Clause 25. The method of any of clauses 23 to 24, further comprising forming a plurality of metal layer cuts, wherein each metal layer cut of the plurality of metal layer cuts is aligned with a boundary of each cell.

Clause 26. The method of any of clauses 23 to 25, wherein each cell of the plurality of cells has a height that is less than seven times the pitch.

Clause 27. A method of fabricating a semiconductor device, the method comprising: forming a plurality of cells, wherein each cell of the plurality of cells comprises four metal tracks running substantially parallel to each other in a first metal layer to provide signal routing; and forming a plurality of wrapped channels having an asymmetric distribution, wherein a first distance between a first pair of adjacent wrapped channels is different than a second distance between a second pair of adjacent wrapped channels.

Clause 28. The method of clause 27, further comprising forming a single bar via to couple two metal tracks in the first metal layer.

Clause 29. The method of any of clauses 27 to 28, wherein each cell of the plurality of cells includes at least one narrow nanosheet and at least one wide nanosheet.

Clause 30. The method of any of clauses 27 to 29, wherein a pitch between two adjacent wrapped channels of the plurality of wrapped channels is between about 24 nanometers to about 40 nanometers.

Accordingly, it will be appreciated, for example, that an apparatus or any component of an apparatus may be configured to (or made operable to or adapted to) provide functionality as taught herein. This may be achieved, for example: by manufacturing (e.g., fabricating) the apparatus or component so that it will provide the functionality; by programming the apparatus or component so that it will provide the functionality; or through the use of some other suitable implementation technique. As one example, an integrated circuit may be fabricated to provide the requisite functionality. As another example, an integrated circuit may be fabricated to support the requisite functionality and then configured (e.g., via programming) to provide the requisite functionality. As yet another example, a processor circuit may execute code to provide the requisite functionality.

Moreover, the methods, sequences, and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor (e.g., cache memory).

While the foregoing disclosure shows various illustrative aspects, it should be noted that various changes and modifications may be made to the illustrated examples without departing from the scope defined by the appended claims. The present disclosure is not intended to be limited to the specifically illustrated examples alone. For example, unless otherwise noted, the functions, steps, and/or actions of the method claims in accordance with the aspects of the disclosure described herein need not be performed in any particular order. Furthermore, although certain aspects may be described or claimed in the singular, the plural is contemplated unless limitation to the singular is explicitly stated.

What is claimed is:

1. An apparatus comprising a semiconductor device comprising:
a plurality of cells, wherein each cell of the plurality of cells comprises:
a power rail on a first boundary of the cell;
a ground on a second boundary of the cell;
four metal tracks in the cell running substantially parallel to each other in a first metal layer to provide signal routing;
a bar via disposed above two inner metal tracks of the four metal tracks and directly, physically connecting the two inner metal tracks;
a second metal layer disposed above the bar via; and
four wrapped channels disposed below the second metal layer and having a uniform pitch, wherein:
two active wrapped channels of the four wrapped channels are disposed opposite two outer metal tracks of the four metal tracks; and
two inactive wrapped channels of the four wrapped channels are disposed opposite the two inner metal tracks.

2. The apparatus of claim 1, further comprising a plurality of metal layer cuts, wherein each metal layer cut of the plurality of metal layer cuts is aligned with a boundary of each cell.

3. The apparatus of claim 2, wherein a metal layer cut of the plurality of metal layer cuts comprises a single cut that includes a single vertical layer.

4. The apparatus of claim 2, wherein a metal layer cut of the plurality of metal layer cuts comprises a merged cut that includes two adjacent vertical layers.

5. The apparatus of claim 1, wherein each wrapped channel of the plurality of wrapped channels comprises a fin that has a gate wrapped around a channel on three sides.

6. The apparatus of claim 1, wherein each wrapped channel of the plurality of wrapped channels comprises a nanosheet that has a gate wrapped around a channel in a Gate All Around (GAA) configuration.

7. The apparatus of claim 1, wherein each wrapped channel of the plurality of wrapped channels comprises an active region.

8. The apparatus of claim 7, wherein the active region comprises one of a P-type metal oxide semiconductor or an N-type metal oxide semiconductor.

9. The apparatus of claim 1, wherein each cell of the plurality of cells has a height that is less than seven times the pitch.

10. The apparatus of claim 1, wherein the pitch is about 27 nanometers.

11. The apparatus of claim 1, wherein the apparatus is selected from the group consisting of: a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, a base station, and a device in an automotive vehicle.

12. The apparatus of claim 1, wherein the power rail has a height less than 46 nanometers.

13. The apparatus of claim 1, wherein the power rail has a height less than 40 nanometers.

14. The apparatus of claim 1, wherein the power rail has a height of about 36 nanometers.

15. The apparatus of claim 1, wherein each cell of the plurality of cells has a height less than 200 nanometers.

16. The apparatus of claim 1, wherein each cell of the plurality of cells has a height less than 180 nanometers.

17. The apparatus of claim 1, wherein each cell of the plurality of cells has a height of about 162 nanometers.

18. The apparatus of claim 1, wherein the four metal tracks in the cell are substantially parallel to the power rail and the ground of the cell.

19. The apparatus of claim 1, wherein the four metal tracks in the cell are located between the power rail and the ground of the cell and are spaced from the first boundary and the second boundary.

20. The apparatus of claim 1, wherein the second boundary is a common boundary between the cell and another cell of the plurality of cells.

* * * * *